United States Patent [19]

Shimizu et al.

[11] Patent Number: 5,281,556
[45] Date of Patent: Jan. 25, 1994

[54] PROCESS FOR MANUFACTURING A MULTI-LAYER LEAD FRAME HAVING A GROUND PLANE AND A POWER SUPPLY PLANE

[75] Inventors: Mitsuharu Shimizu, Nagano; Yoshiki Takeda, Iiyama, both of Japan

[73] Assignee: Shinko Electric Industries Co., Ltd., Nagano, Japan

[21] Appl. No.: 701,183

[22] Filed: May 16, 1991

[30] Foreign Application Priority Data

May 18, 1990 [JP] Japan .................. 2-130083

[51] Int. Cl.⁵ .................. H01L 21/58; H01L 21/60
[52] U.S. Cl. .................. 437/206; 437/208; 437/220
[58] Field of Search .............. 437/206, 207, 208, 220; 357/70; 156/310

[56] References Cited

U.S. PATENT DOCUMENTS

| | | | |
|---|---|---|---|
| 3,526,568 | 6/1969 | Kepple et al. | 156/310 |
| 4,835,120 | 5/1989 | Mallik et al. | 437/209 |
| 4,957,882 | 9/1990 | Shinomiya | 156/310 |
| 5,023,202 | 6/1991 | Long et al. | 437/207 |
| 5,043,227 | 8/1991 | Perry et al. | 156/310 |

FOREIGN PATENT DOCUMENTS 1-084689 3/1989 Japan .
2-094464 4/1990 Japan .

OTHER PUBLICATIONS

Proceedings of the 1989 Japan International Electronic Manufacturing Technology Symposium, Apr. 26, 1989, Nara, Japan, pp. 221-229, D. Mallik et al., "Multi-layer Molded Package", p. 221, paragraph Package Design, FIG. 3.

Primary Examiner—Olik Chaudhuri
Assistant Examiner—David E. Graybill
Attorney, Agent, or Firm—Michael N. Meller

[57] ABSTRACT

A process for manufacturing a multi-layer semiconductor lead frame comprising the step of adhering a lead frame strip to a metal power supply plane strip and a metal ground plane strip.

2 Claims, 5 Drawing Sheets

Fig. 8
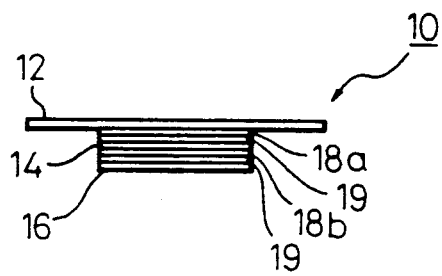
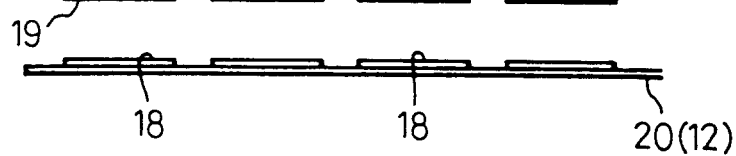

5,281,556

PROCESS FOR MANUFACTURING A MULTI-LAYER LEAD FRAME HAVING A GROUND PLANE AND A POWER SUPPLY PLANE

BACKGROUND OF THE INVENTION

1. Field of the Invention

This invention relates to a lead frame, more particularly to a multi-layer lead frame having at least one metal plate or plane, hereinafter referred to as "metal plane" which is used for a semiconductor device. This invention also relates to a process for manufacturing such a multi-layer lead frame.

2. Related Art

A plastic package, whose speed and heat-radiation characteristics are as good as those of a ceramic package, has recently been developed. In addition, in place of a conventional single-layer lead frame, a multi-layer plastic lead frame for a semiconductor device has also been developed.

Such a multi-layer lead frame comprises at least one metal plane connected via an insulative layer to the bottom surfaces of inner leads. Using such a multi-layer lead frame, it will be possible to mount a relatively power-consumable semiconductor chip on the metal plane, due to a good heat radiation capacity of the metal plane. Also, the metal plane can be used as a ground layer or a power supply layer to improve the electrical characteristics of the semiconductor device.

FIG. 10 shows a conventionally known multi-layer lead frame which comprises three layers, i.e., a signal layer (i.e., lead frame 12) and two metal planes, i.e., a power supplying metal plane 14 and a ground metal plane 16, which are laminated via insulative tape 17a and 17b made of heat-resistant material made of, such as a polyimide.

Using such a multi-layer lead frame, it would be possible to prevent a so-called cross talk which might be generated between signal lines and also possible to reduce the capacitance between the lines or inductance.

As shown in FIG. 10, in order to manufacture the abovementioned multi-layer lead frame, at the first stage, a lead frame 12, a power supplying metal plane 14, a ground metal plane 16, and insulative tape pieces 17a and 17b each having respective surfaces providing with adhesive layers must individually be made. Then, these individual pieces must be positioned by using a special instrument (not shown), such as an image reader, and then heat-pressed to laminate and adhere them together.

However, in the above mentioned manufacturing process, it has been very troublesome and laborious work to position and laminate the five layers including the insulative tape pieces 17a and 17b by using the image reader. It also requires a lot of time and, therefore, an effective production rate would not be expected. In addition, after these pieces are gripped by the gripping means and laminated, when the pieces are released or disengaged from the gripping means, the laminated pieces might be moved slightly and, therefore, a precise laminated multi-layer lead frame might not be obtained.

The multi-layer lead frame should originally have a good quality for multi-pin and, therefore, inner leads thereof are usually very dense. Thus, even a slight abberation might cause a disconnection between the terminals of the power supply plane 14 and ground plane 16 and the corresponding inner leads of the lead frame 10.

In addition, an insulative sheet must be punched to form the insulative tape pieces 17a and 17b. Such a punching process requires a relatively laborious work.

SUMMARY OF THE INVENTION

An object of the present invention is to provide a multi-layer lead frame and a process for manufacturing the same, in which an insulative tape piece is no longer required and, therefore, it is possible to reduce the time to make the same.

Another object of the present invention is to provide a multi-layer lead frame and a process for manufacturing the same, in which positioning of the planes can be conducted precisely and effectively.

According to the present invention, there is provided a multi-layer lead frame for a semiconductor device comprising: a lead frame body made of a metal strip; and at least one metal plane, which is independent by itself from said lead frame body, said metal plane being adhered to said lead frame body by means of a coated adhesive film, without using any insulative tape piece.

According to another aspect of the present invention, there is provided a multi-layer lead frame for a semiconductor device comprising: a lead frame body made of a metal strip; and at least one metal plane, which is independent by itself from said lead frame body, but said metal plane being adhered to said lead frame body by means of two layers consisting of a coated adhesive film and a coated insulative resin film, without using any insulative tape piece.

According to a still another aspect of the present invention, there is provided a process for manufacturing a multi-layer lead frame for a semiconductor device comprising a lead frame body and at least one metal plane being adhered to said lead frame body by means of an adhesive material, said process comprising the following steps of: forming a lead frame strip and at least one metal plane strip, said lead frame strip comprising a plurality of said lead frame bases sequentially arranged and continuously connected to each other, and said metal plane strip comprising a plurality of said metal planes sequentially arranged and continuously connected to each other; coating at least one of said lead frame strip and said metal plane strip with an adhesive material in accordance with a predetermined adhesion pattern; positioning said metal plane strip with respect to said lead frame strip; and, adhering said at least one metal plane of said metal plane strip to said at least one lead frame body of said lead frame strip via said adhesive material.

Thus, in the present invention, the multi-layer lead frame can be effectively and precisely manufactured, since the positioning of the lead frame strip and the metal plane strip can be easily arranged. Also, coating these planes with an adhesive material or an insulative resin can be easily and precisely performed, by using a masking, for example. Therefore, the positions of the metal plane with respect to the lead frame and the patterns of the adhesive material and/or the insulative resin can be precisely defined and controlled.

BRIEF DESCRIPTION OF THE DRAWINGS

FIG. 8 is a schematic cross-sectional view of another embodiment of a multi-layer lead frame according to the present invention;
FIGS. 9(a), 9(b), and 9(c) are schematic cross-sectional views of the lead frame strip, the power supply plane strip, and the ground plane strip, respectively; and,
FIG. 10 is an exploded view of a conventional multi-layer lead frame known in the prior art.

DESCRIPTION OF THE PREFERRED EMBODIMENTS

Figure 1:
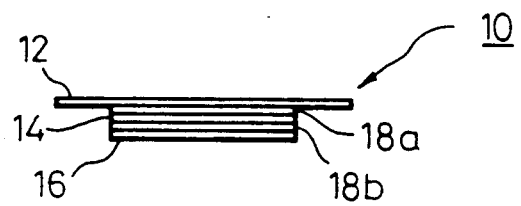
FIG. 1 is a schematic cross-sectional view of a multi-layer lead frame according to the present invention.

Referring now to the drawings, wherein FIG. 1 shows a preferred embodiment of a multi-layer lead frame according to the present invention. The multi-layer lead frame generally indicated by a reference numeral 10 comprises a lead frame 12 and two metal planes, i.e., a power supplying metal plane 14 and a ground metal plane 16, which are affixed to the lead frame 12 via thermosetting insulative adhesive resins 18a and 18b, respectively.

Figure 2:
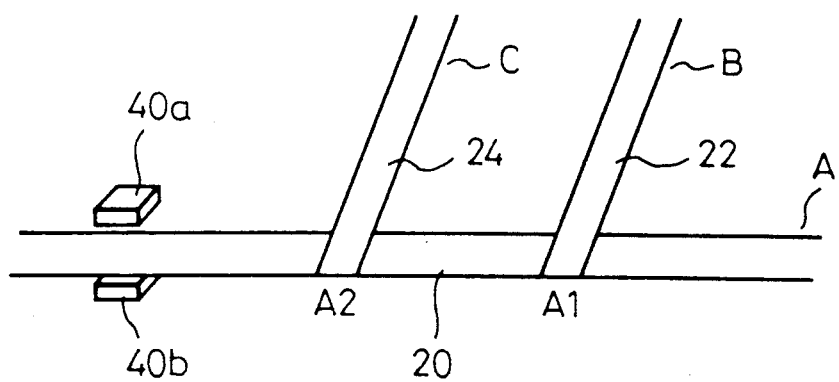
FIG. 2 is a schematic view illustrating a manufacturing process of the multi-layer lead frame.

The multi-layer lead frame 10 can be manufactured by a process as described below with reference to FIG. 2, wherein A is a line of process for manufacturing a lead frame strip 20, B is a line of process for manufacturing a power supply plane strip 22, and C is a line of process for manufacturing a ground plane strip 24. The process line B intersects perpendicularly at A1 with the process line A and, at the downstream of the intersection A1, the process line C intersects perpendicularly at A2 with the process line A.

Figure 3:
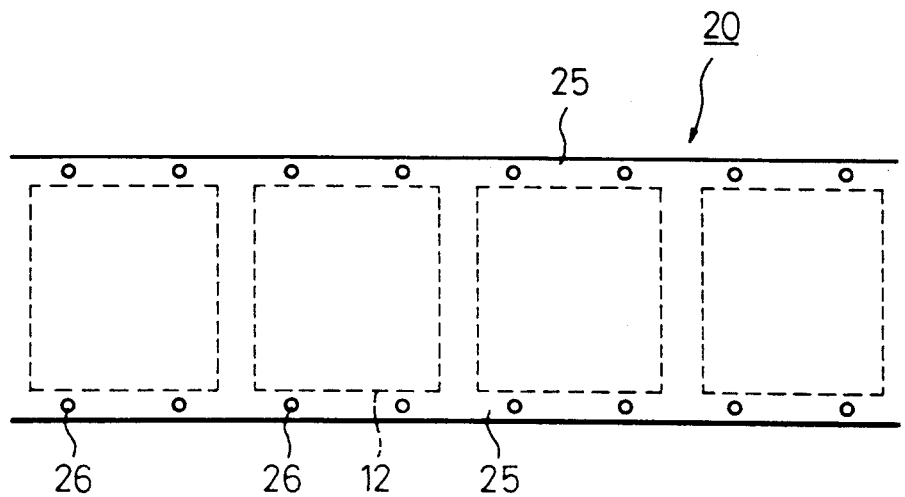
FIG. 3 is a plan view of a lead frame strip.

In the process line A, a metal strip is forwardly fed through several metal molds (not shown). Along these molds the metal strip is formed in a conventionally known manner. Thus, as schematically shown in FIG. 3, obtained is a lead frame strip 20 comprising a support frame 25 and a plurality of lead frames 12 longitudinally, sequentially and continuously arranged and connected to each other by means of connecting portions. The support frame 25 is provided with a plurality of regularly arranged guide holes 26 which cooperate with guide means (not shown) for feeding this lead frame strip 20 forwardly through the metal molds.

Figure 4:
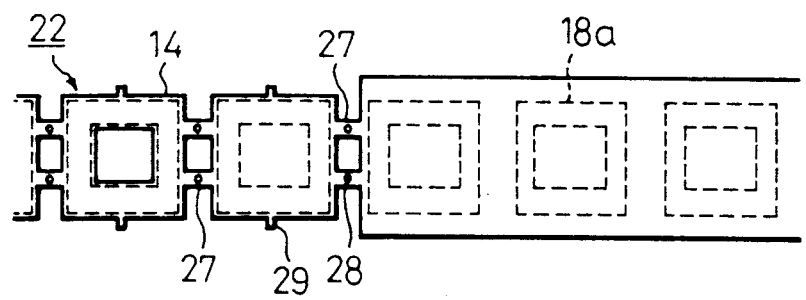
FIG. 4 is a plan view of a power supply plane strip.

In the process line B, another metal strip is first intermittently coated with an adhesive made of thermosetting resin in accordance with a predetermined adhesion pattern defined between the lead frame 12 and the power supply plane 14. The metal strip is then fed to a low-temperature dryer (not shown), where the coated adhesive is dried and becomes a coated film 18a. Then, the metal strip is fed forwardly through the metal molds. In these metal molds, the metal strip is formed as schematically shown in FIG. 4. The above results in a power supply plane strip 22 comprising a plurality of power supply planes 14 longitudinally, sequentially and continuously arranged and connected to each other by means of connecting portions 27. The connecting portions 27 are provided with regularly arranged positioning guide holes 28. A reference numeral 29 indicates terminals protruded from the power supply plane 14. A reference numeral 18 indicates a pattern of the adhesive film.

Figure 5:
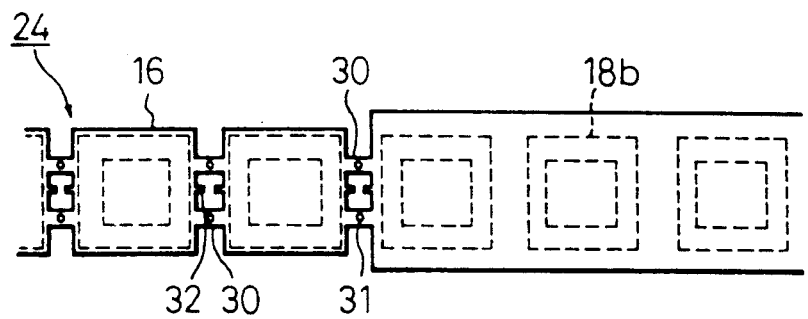
FIG. 5 is a plan view of a ground plane strip.

In the same manner as the above, in the process line C, still another metal strip is first intermittently coated with an adhesive made of thermosetting resin in accordance with a predetermined adhesive pattern defined between the power supply plane 14 and the ground plane 16. The metal strip is then dried, so that the adhesive becomes a coated film 18b. Then, the metal strip is fed forwardly through the metal molds. In these metal molds, the metal strip is formed as schematically shown in FIG. 5 and obtained is a ground plane strip 24 comprising a plurality of ground planes 16 longitudinally, sequentially and continuously arranged and connected to each other by means of connecting portions 30. The ground plane strip 24 is also provided with positioning guide holes 31 and terminals 32.

The above-mentioned power supply plane strip 22 is divided into an individual power supply plane 14 at the intersection A1 (FIG. 1) of the process line A. The divided power supply plane 14 is then positioned at a predetermined position on the lead frame 12 and provisionally adhered thereto by means of the adhesion film 18a.

Figure 6:
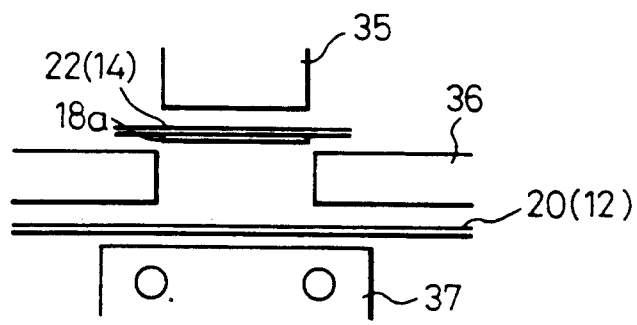
FIGS. 6 and 7 are schematic cross-sectional views of heat pressing devices.

FIG. 6 shows an example of the heat-press apparatus which comprises a cutting punch 35, a die 36, and a heater block 37. When the power supply plane strip 22 is positioned by means of the above-mentioned positioning guide holes 28 at a predetermined position above the lead frame 12 and fed to a position between the cutting punch 35 and the die 36, the cutting punch 35 is lowered to cut the connecting portions 27, so that the power supply plane strip 22 is cut into the individual power supply plane 14, which is then heat-pressed against the lead frame 12 provisionally heated by the heater block 37. The heat-pressing in this process is sufficient to soften the adhesive film 18a, but not to completely harden the adhesive film 18a.

The pressing surface of the cutting punch 35 is provided with some suction holes (not shown) communicated to any vacuum means (not shown) for sucking to hold the power supply plane 14 and simultaneously to press the same against the lead frame 12. Thus, the power supply plane 14 is stably held against the lead frame 12 of the lead frame strip 20.

The lead frame strip 20, to which the power supply plane 14 is adhered, is further fed forwardly and, at the intersection A2 of the process line C, the ground plane 16 is then provisionally adhered to the power supply plane 14 by means of the adhesion film 18b in the same manner as mentioned above. That is to say, when the lead frame strip 20 and the ground plane strip 24 are positioned to each other by means of the respective guide holes 26 and 31 and fed forwardly to the intersection A2 of the process line C, the cutting punch (not shown) is lowered to cut into the individual ground plane 16, which is then heat-pressed against the power supply plane 14 on the lead frame 12 provisionally heated by the heater block to soften to provisionally adhere the ground plane 16 against the power supply plane 14.

Thus, the lead frame strip 20, to which the power supply plane 14 and the ground plane strip 16 are laminated, is further fed forwardly along the process line A. The lead strip 20 is further heated and pressed by upper and lower heater blocks 41a and 41b and thus the adhesive films or layers 18a and 18b are suitably thermoset to obtain a multi-layer lead frame 10.

The respective terminals 29 and 32 of the power supply plane 14 and the ground plane strip 16 are connected to the corresponding leads of the lead frame 10 by a spot welding or the like.

Although, in the above-mentioned embodiment, the adhesive film 18a for adhering the power supply plane 14 to the lead frame 12 is provided on the power supply plane 14, such an adhesive film 18a may be provided on the lead frame strip 20.

Otherwise, the power supply plane 14 may be provided on its respective surfaces with adhesive films for adhering the same to the lead frame 12, as well as to the ground plane 16.

Figure 7:
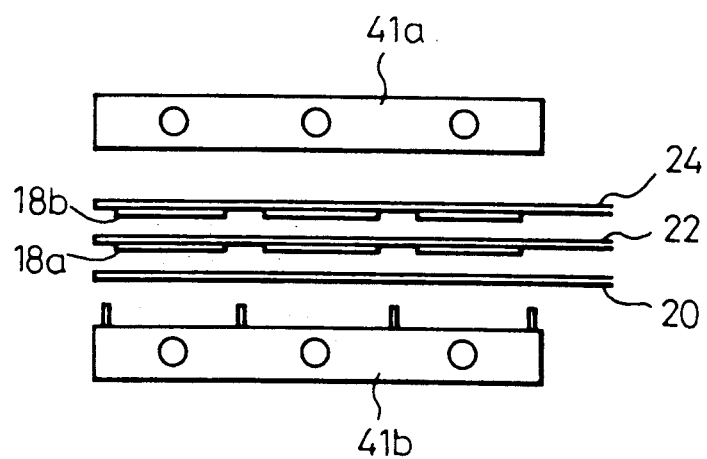
Figure 10:
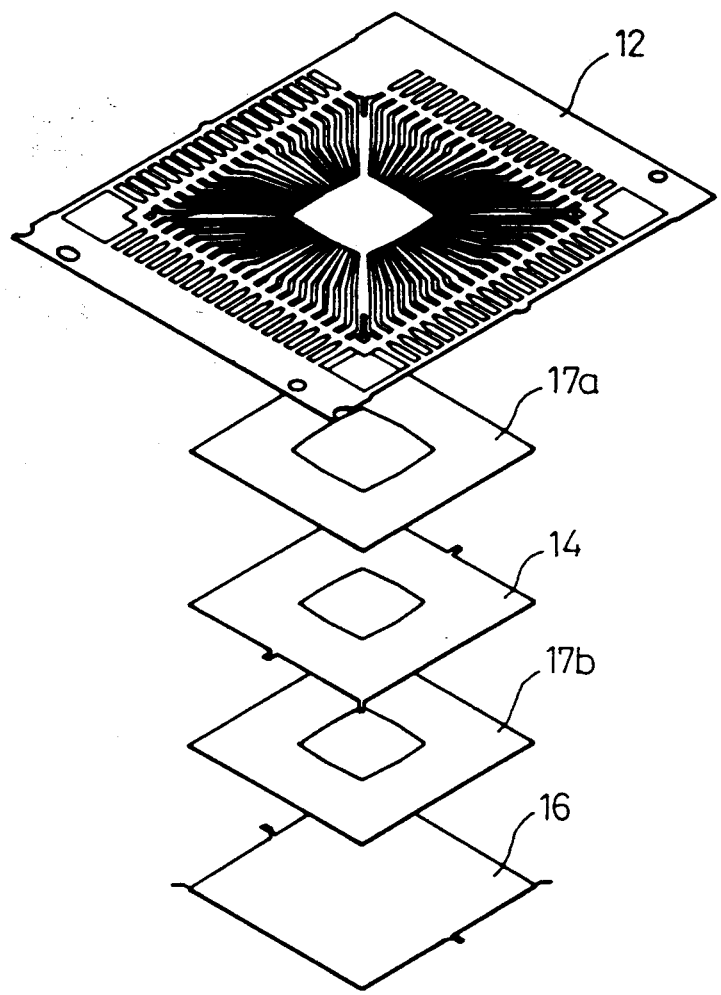

FIG. 7 shows another embodiment of a laminating process according to the present invention. In this embodiment, the power supply plane strip 22 and the ground plane strip 24 are not cut into individual planes, but these strips are themselves positioned with respect to each other by any positioning means, such as, pilot pins and superimposed onto the lead frame strip 20, so that they are heat-pressed together by means of upper and lower heater blocks 41a and 41b to thermoset the adhesive films 18. The connecting portions 27 and 30 of the power supply plane strip 22 and the ground plane strip 24 are thereafter cut into individual planes. These connecting portions 27 and 30 may be provided at the base thereof with V-shaped notches or the like extending to the direction of thickness so as to easily cut these connecting portions.

FIG. 8 shows another embodiment of a multi-layer lead frame 10 having a lead frame 12, a power supply plane 14, and a ground plane 16. In this embodiment, however, the respective planes are adhered to each other by means of two insulative layers comprising an adhesive film 18 made of a thermosetting resin as in the previous embodiment and another insulative resin film 19, which is an insulative liquid resin coated and dried.

According to this embodiment, since the two insulative layers 18 and 19 are served to keep a predetermined thickness between the respective planes, an insulation efficiency can still be improved. It should not be understood that the adhesive film 18 and the insulative resin film 19 are limited to be provided between the lead frame 12 and the power supply plane 14, and between the power supply plane 14 and the ground plane 16.

FIG. 9 shows another embodiment of a manufacturing process of a multi-layer lead frame according to this invention. FIG. 9(a) shows a ground plane strip 24 which is formed on the process line C (FIG. 1). FIG. 9(b) shows a power supply plane strip 22 which is formed on the process line B (FIG. 1). FIG. 9(c) shows a lead frame plane 20 which is formed on the process line A (FIG. 1), in the same manner as mentioned above.

In this embodiment, however, the ground plane 16 is provided on its surface facing to the power supply plane 14 with an insulative resin film 19 and also provided on the opposite surface with an adhesive film 18 of thermosetting resin. Also, the power supply plane 14 is provided on its surface facing to the lead frame 12 with an insulative resin film 19 and provided on the opposite surface with an adhesive film 18 of thermosetting resin.

The lead frame 12 and the respective planes 14 and 16 are then laminated and heat-pressed together. Thus, the adhesive film 18 is thermoset to obtain a laminated multi-layer lead frame.

In this laminating process, the power supply plane strip 22 and the ground plane strip 24 may be first positioned and then cut into individual planes to be laminated, in the same manner as the previous embodiment shown in FIG. 6. Otherwise, the power supply plane strip 22 and the ground plane strip 24 may be positioned, laminated, and heat-pressed with respect to the lead frame 12, so that the adhesive films 18 are thermoset, and then divided into individual planes by the connecting portions.

Although, in the above mentioned embodiments, the multi-layer lead frame comprises three layers, i.e., the lead frame 12, the power supply plane 14 and the ground plane 16, this invention can also be applied to the other multi-layer lead frame comprising, such as, two layers, i.e., a lead frame and a single metal plane. In this case, the metal plane may be a power supply plane, a ground plane or a radiation/stage plane which is not electrically connected to the lead frame.

A multi-layer lead frame according to the present invention may, of course, be comprised of four or more layers.

It should be understood by those skilled in the art that the foregoing description relates to only preferred embodiments of the disclosed invention and that various changes and modifications may be made in the invention without departing form the sprit and scope thereof.

We claim:

1. A process for manufacturing a multi-layer lead frame for a semiconductor device comprising a lead frame body and metal planes including at least one power supply plane and at least one ground plane being adhered to said lead frame body by means of an adhesive material, said process comprising the following steps of:

forming a lead frame strip, at least one power supply plane strip and at least one ground strip, each of said strips having surfaces, said lead frame strip comprising a plurality of lead frame bases consecutively arranged and continuously connected to each other, and each of said power supply and ground strips comprising a plurality of metal planes sequentially arranged and continuously connected to each other.

coating one surface of a lead frame strip with one material selected from a first group consisting of an adhesive material and an insulative material;

coating one surface of said at least one power supply plane strip with an adhesive material and coating said other surface thereof with an insulative material;

coating one surface of said at least one ground plane strip with the other material of said first group;

positioning said power supply plane strip between said coated surfaces of said lead frame strip and said ground strip so that said adhesive material of said power supply plane strip faces the insulative material on the surface of one of said other strips and said insulative material of said power supply plane strip faces said adhesive material on the surface of said other strip; and adhering said lead frame strip, said at least one power supply plane strip and said at least one ground plane strip together via said adhesive material and said insulative material.

2. A process as set forth in claim 1, wherein said insulative material is gelatinous, is dried and, therefore, becomes a resin film adhering said metal plane to said lead frame strip.

* * * * *

UNITED STATES PATENT AND TRADEMARK OFFICE
CERTIFICATE OF CORRECTION

PATENT NO. : 5,281,556
DATED : January 25, 1994
INVENTOR(S) : SHIMIZU et al

It is certified that error appears in the above-indentified patent and that said Letters Patent is hereby corrected as shown below:

Title Page, left column, amend item[73] to read:

--[73] Assignee: Shinko Electric Industries Co., Ltd., Nagano, Japan and Intel Corporation, Santa Clara, California--

Signed and Sealed this

Eleventh Day of April, 1995

Attest:

BRUCE LEHMAN

Attesting Officer

Commissioner of Patents and Trademarks